United States Patent
Cloos et al.

(10) Patent No.: US 10,725,132 B2
(45) Date of Patent: Jul. 28, 2020

(54) METHOD AND APPARATUS FOR MITIGATING THE EFFECT OF MAGNETIZATION TRANSFER IN MODEL-BASED MAGNETIC RESONANCE TECHNIQUES

(71) Applicants: NEW YORK UNIVERSITY, New York, NY (US); SIEMENS HEALTHCARE GmbH, Erlangen (DE)

(72) Inventors: Martijn Cloos, Long Island City, NY (US); Tom Hilbert, Lausanne (CH); Tobias Kober, Lausanne (CH)

(73) Assignees: Siemens Healthcare GmbH, Erlangen (DE); New York University, New York, NY (US)

( * ) Notice: Subject to any disclaimer, the term of this patent is extended or adjusted under 35 U.S.C. 154(b) by 141 days.

(21) Appl. No.: 15/822,474

(22) Filed: Nov. 27, 2017

(65) Prior Publication Data
US 2019/0162803 A1 May 30, 2019

(51) Int. Cl.
*G01R 33/48* (2006.01)
*G01R 33/56* (2006.01)
*G01R 33/50* (2006.01)

(52) U.S. Cl.
CPC ..... *G01R 33/4828* (2013.01); *G01R 33/5605* (2013.01); *G01R 33/5608* (2013.01); *G01R 33/50* (2013.01)

(58) Field of Classification Search
CPC ............ G01R 33/4828; G01R 33/5605; G01R 33/5608; G01R 33/50
USPC ......................................................... 324/309
See application file for complete search history.

(56) References Cited

U.S. PATENT DOCUMENTS

| 8,723,518 | B2 | 5/2014 | Seiberlich et al. |
| 10,261,155 | B2 * | 4/2019 | Cohen .................. G01R 33/543 |
| 10,345,411 | B2 * | 7/2019 | Grodzki ............. G01R 33/3854 |
| 2013/0265047 | A1 * | 10/2013 | Griswold ............... G01R 33/56 324/309 |
| 2014/0292328 | A1 * | 10/2014 | Brady-Kalnay ... G01R 33/3614 324/309 |

(Continued)

OTHER PUBLICATIONS

Ma, D., Gulani, V., Seiberlich, N., Liu, K., Sunshine, J.L., Duerk, J.L. and Griswold, M.A., 2013. Magnetic resonance fingerprinting. Nature, 495(7440), p. 187. (Year: 2013).*

(Continued)

*Primary Examiner* — Christopher P McAndrew
(74) *Attorney, Agent, or Firm* — Schiff Hardin LLP

(57) ABSTRACT

In a magnetic resonance (MR) apparatus, and model-based method, for identifying a nuclear spin-dependent attribute of a subject, MR signals are acquired in multiple repetitions of an MR data acquisition sequence that is changed from repetition-to-repetition so as to deliberately encode effects of magnetization transfer between nuclear spins into the acquired MR signals. A model is generated, composed of at least two molecule pools, in which a single magnetization transfer parameter is used that is derived from the MR signals in which the magnetization transfer is encoded. A nuclear spin-dependent attribute of the subject is then identified, by comparing at least one MR signal evolution from the subject to at least one signal evolution produced by the model.

14 Claims, 5 Drawing Sheets

(56) References Cited

U.S. PATENT DOCUMENTS

| | | | | |
|---|---|---|---|---|
| 2014/0303478 | A1* | 10/2014 | Roche | G01R 33/5608 600/410 |
| 2015/0186606 | A1* | 7/2015 | Kuang | A61B 5/055 702/19 |
| 2015/0272467 | A1* | 10/2015 | Warfield | A61B 5/055 382/131 |
| 2015/0301141 | A1* | 10/2015 | Griswold | G01R 33/4828 382/131 |
| 2015/0301142 | A1* | 10/2015 | Griswold | G01R 33/4828 324/309 |
| 2015/0346301 | A1* | 12/2015 | Cauley | G01R 33/4828 324/309 |
| 2016/0155238 | A1* | 6/2016 | Bachschmidt | G06T 7/11 382/131 |
| 2016/0270687 | A1* | 9/2016 | Brady-Kalnay | A61B 5/055 |
| 2016/0282434 | A1* | 9/2016 | Seiberlich | G01R 33/483 |

OTHER PUBLICATIONS

Mougin, O.E., Coxon, R.C., Pitiot, A. and Gowland, P.A., 2010. Magnetization transfer phenomenon in the human brain at 7 T. Neuroimage, 49(1), pp. 272-281. (Year: 2010).*

Ontaneda, D., Nakamura, K. and Griswold, M., 2016. Magnetic Resonance Fingerprinting: A New Window into Multiple Sclerosis. Dear Colleagues, 2, p. 17. (Year: 2016).*

Deoni et al., "Determination of Optimal Angles for Variable Nutation Proton Magnetic Spin-Lattice, T1, and Spin-Spin, T2, Relaxation Times Measurement" *Magnetic Resonance in Medicine*, 51(1), (2004).

Ma et al., "Magnetic Resonance Fingerprinting," (1) *Nature*, 495(7440), 187-192 (2013).

Henkelman et al., "Magnetization Transfer in MRI, A Review," *NMR in Biomedicine* (2001).

Morrison et al., "Modeling Magnetization Transfer for Biological-Like Systems Using a Semi-Solid Pool with a Super-Lorentzian Lineshape and Dipolar Reservoir," *J. Magn Reson*, Series B, 108(2) (1995).

Hennig et al., Calculation of Flip Angles for Echo Trains with Predefined Amplitudes with the Extended Phase Graph (EPG)-Algorithm Principles and Applications to Hyperecho and TRAPS Sequences, *Magnetic Resonance in Medicine*, 51(1) (2004).

Cloos et al., "Multiparametric Imaging with Heterogeneous Radiofrequency Fields," *Nature Communication*, (2016).

Stanisz et al. "Characterizing White Matter With Magnetization Transfer and $T_2$," Magnetic Resonance in Medicine, vol. 42, pp. 1128-1136 (1999).

Gloor et al, "Quantitative Magnetization Transfer Imaging Using Balanced SSFP," *Magnetic Resonance in Medicine*, 60(3), 691-700 (2008).

* cited by examiner

Simplified Model

Lineshape

Saturation Profile

METHOD AND APPARATUS FOR MITIGATING THE EFFECT OF MAGNETIZATION TRANSFER IN MODEL-BASED MAGNETIC RESONANCE TECHNIQUES

BACKGROUND OF THE INVENTION

Field of the Invention

The present invention concerns a method and a magnetic resonance (MR) apparatus with which the effect of magnetization transfer in model-based MR techniques is mitigated. In particular, the method and apparatus can be of significant benefit in magnetic resonance fingerprinting.

Description of the Prior Art

Quantitative magnetic resonance (MR) measurements strive to estimate tissue-specific parameters with minimal experimental bias. Until recently, such methods have mostly focused on relatively simple spin evolutions for which analytic signal solutions can be derived—mostly aiming to measure the two main relaxation parameters in magnetic resonance imaging (MRI), $T_1$ and $T_2$. Early techniques developed to measure the relaxation time, for example, relied on a series of inversion-recovery measurements to estimate the longitudinal relaxation time ($T_1$) and spin-echo measurements in order to estimate the transverse relaxation time ($T_2$). Although such measurements can provide excellent results, they are generally too time-consuming to be used in routine clinical examinations.

For years, the search for faster methods has strived to obtain a balance between acquisition speed, model simplicity, accuracy, and precision. One of the most widely used approaches in the last years is the DESPOT12 technique (Deoni et al., "Determination of Optimal Angles for Variable Nutation Proton Magnetic Spin-Lattice, T1, and Spin-Spin, T2, Relaxation Times Measurement" *Magnetic Resonance in Medicine,* 51(1), (2004)), combining four (or more) fast measurements to quantify both $T_1$ and $T_2$. Although DESPOT12 is fast and SNR-efficient, it is also sensitive to experimental imperfections and magnetization transfer (MT) effects. These MT effects are due to interactions of the radio frequency pulses used to excite the spins in a measurement with certain molecules in the body. Since this interaction is modulated by the experimental parameters used (e.g. the RF pulse bandwidth), it creates an undesired dependence of the resulting quantitative parameters and the experimental setup if not taken into account.

The impact of MT is especially high in the brain, and it was shown that it has significant correlations with myelin content and axonal count. Therefore, MT can also be exploited as a biomarker for neurological disease where the myelination of the brain is altered, e.g. multiple sclerosis. However, MT effects cannot be described by basic Bloch Equations used in most fast quantitative MRI techniques. Recently, model-based quantitative MR techniques became more attractive for both basic and clinical research. One method which had an important impact in the community is magnetic resonance fingerprinting (MRF), proposed by (Ma et al., "Magnetic Resonance Fingerprinting," (1) *Nature,* 495(7440), 187-192 (2013); also U.S. Pat. No. 8,723,518 B2). MRF moves the focus away from monotone sequences that drive the spins in a steady-state with analytic solutions. Instead, it uses sequence patterns that produce continuously changing transient states, paired with a numerical signal model. The additional degrees of freedom that become available with MRF enable faster imaging and provide the opportunity to deliberately entangle and encode multiple tissue properties and experimental conditions within a single measurement. In order to derive the tissue properties from the measured "fingerprint" signal, MRF uses dictionary fitting. Similar approaches using other model-based qMRI techniques have also been proposed.

SUMMARY OF THE INVENTION

An object of the present invention is to address the problem of MT-biased tissue property estimations in model-based quantitative MR techniques. In accordance with the invention, instead of simply ignoring the effect or trying to minimize its impact, MT is encoded in the measurement by a slight change in the acquisition sequence and the used signal model is extended by incorporating the impact of MT. To this end, a simplified version of a well-known MT signal model is derived. Such simplification is an important achievement of the invention, since both computational effort and probable fitting ambiguities are thereby reduced. This inventive approach (encode MT and complement signal model to incorporate MT) is applied to MRF as an example below, since there is an important application of the invention. The basic inventive concept, however, can be generalized for other model-based quantitative MR techniques.

The invention can be used in any model-based technique wherein an MR signal evolution of a subject is compared to a modelled signal evolution, in order to identify or classify any nuclear spin-dependent attribute of a subject from which the MT signal originates.

DESCRIPTION OF THE PREFERRED EMBODIMENTS

Figure 1:
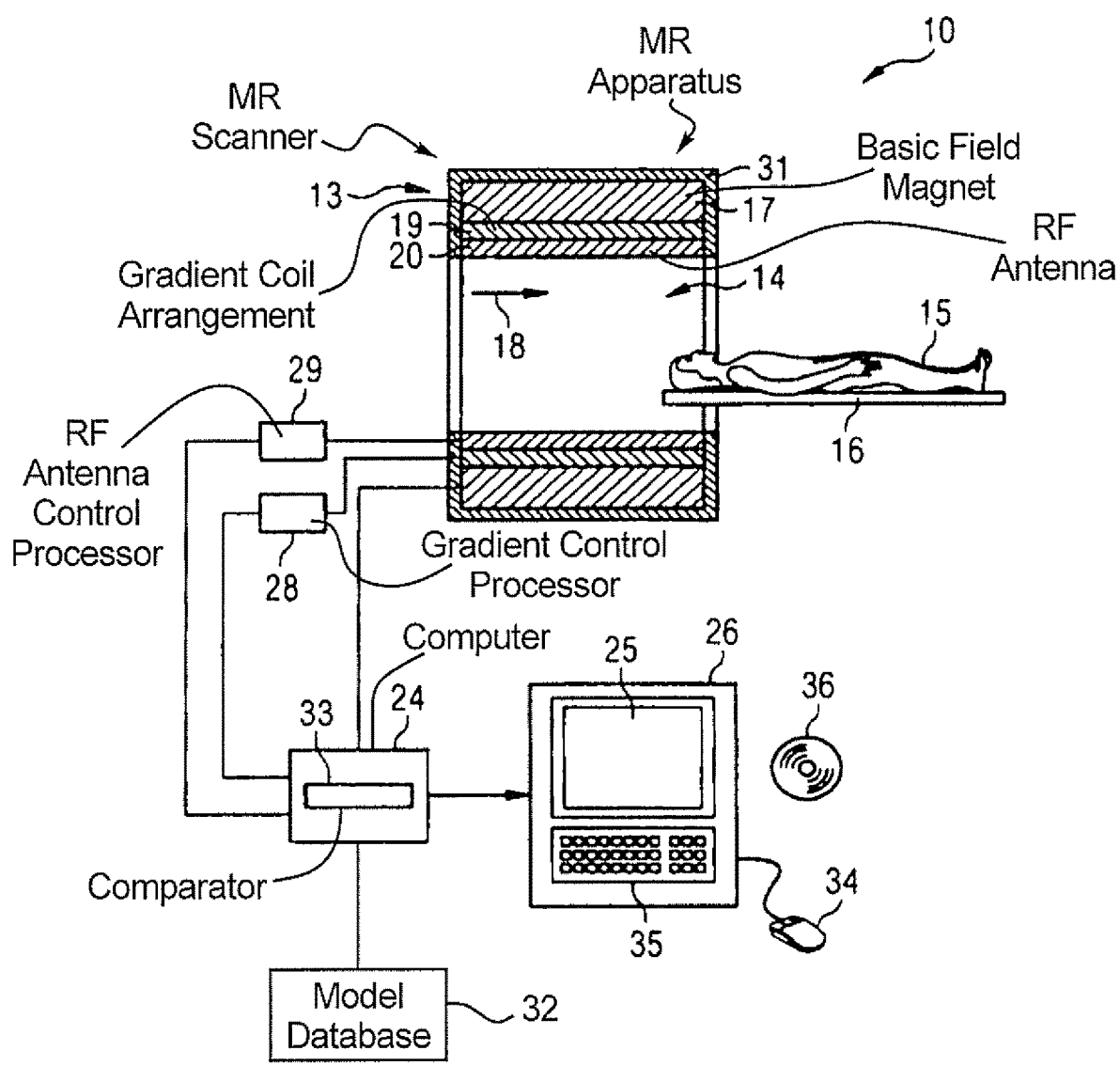
FIG. 1 schematically illustrates a magnetic resonance apparatus constructed and operating in accordance with the present invention.

FIG. 1 is a schematic illustration of a magnetic resonance (MR) apparatus 10 according to the invention. The magnetic resonance apparatus 5 has an MR data acquisition scanner 13 with a basic field magnet 17 for the generation of a strong and constant basic magnetic field 18. The MR scanner 13 has a cylindrical patient receptacle 14 for receiving an examination object, in this case a patient 15. The patient receptacle 14 is cylindrically enclosed by the scanner 13 in a circumferential direction. The patient 15 can be moved into the patient receptacle 14 by a patient support 16. The patient support 16 has a support table for this purpose, which is arranged in a mobile manner inside the MR scanner 13. The scanner 13 is shielded externally by a housing shell 31.

Furthermore, the scanner 13 has a gradient coil arrangement 19 for the generation of a magnetic field gradient that is used for spatial encoding during imaging. The gradient coil arrangement 19 is controlled by a gradient control processor 28. Furthermore, the MR scanner 13 has a radio-frequency (RF) antenna 20, which in this case is designed as a whole body coil permanently integrated into the magnetic resonance scanner 13, and a radio-frequency antenna control processor 29 for the excitation of nuclear spins so as to deviate from the polarization which occurs in the basic magnetic field 18 generated by the basic field magnet 17. The radio-frequency antenna 20 is controlled by the radio-frequency antenna control processor 29 and radiates radio-frequency magnetic resonance frequencies into an examination volume that essentially includes the patient receptacle 14. Furthermore, the radio-frequency antenna 20 is designed to receive magnetic resonance signals from the patient 15.

The magnetic resonance apparatus 10 has a control computer 24 that operates the basic field magnet 17, the gradient control processor 28 and the radio-frequency antenna control processor 29. The computer 24 controls the magnetic resonance apparatus 10 centrally, for example, to perform a predetermined imaging gradient-echo sequence. Control information such as imaging parameters and reconstructed MR images can be provided for a user via an output interface, in this case a display monitor 25, of the magnetic resonance apparatus 10. In addition, the magnetic resonance apparatus 10 has an input interface 26 via which information and/or parameters can be entered by a user during a measurement operation. The computer 24 may include the gradient control processor 28 and/or radio-frequency antenna control processor 29 and/or the display monitor 25 and/or the input interface 26.

The computer 24 has a comparator 33 (which may be embodied as software) that, via the computer 24, accesses a model database 32 in order to compare signal evolutions, or attributes thereof, of one or more models accessed from the model database 32, with a signal evolution, or attributes thereof, acquired from the patient 15 using the MR scanner 13, in an MR fingerprinting procedure.

The selection of corresponding control programs for an MR fingerprinting examination which e.g. is stored on a DVD 36, and the display of the results generated thereby takes place via a screen of a display monitor 25. The input interface 26 includes a keyboard 15, a mouse 16 and the screen of the display monitor 25.

As discussed in the article by Ma et al. cited above, original MR fingerprinting implementation is based on the basic Bloch Equations. These equations describe the spin dynamics assuming that the sample in each voxel can be characterized by a single $T_1$ and $T_2$ relaxation constant in combination with the proton density PD (here denoted as $M_o$ that scales the overall magnitude of the signal. This model accurately describes simple phantoms, such as those containing homogeneous compartments with different relaxation times. However, for most quantitative MRI techniques, this model is only a simplified model for the heterogeneous microscopic structure present in organic samples. In addition to the fact that each voxel may contain multiple free water compartments—each containing a different chemical environment with distinct effective $T_1$ and $T_2$—the model also does not take into account that there is physical interaction between hydrogen atoms in free water molecules and those bound to macro-molecules, known as the above-mentioned MT effect. Neglecting the dynamic interaction between free and bound hydrogen atoms may result in a sequence- and protocol-dependent $T_1$ and $T_2$ bias. Such dependencies are obviously contrary to the idea of quantitative MR and should thus be minimized. In order to explain the departure of the invention from conventional techniques, the common model for magnetization transfer, as detailed by Henkelman et al., "Magnetization Transfer in MRI. A Review," *NMR in Biomedicine* (2001), will be described, followed by the derivation of a simplified model in accordance with the invention, for use in a fingerprinting signal framework.

Common Model of Magnetization Transfer

Figure 2:
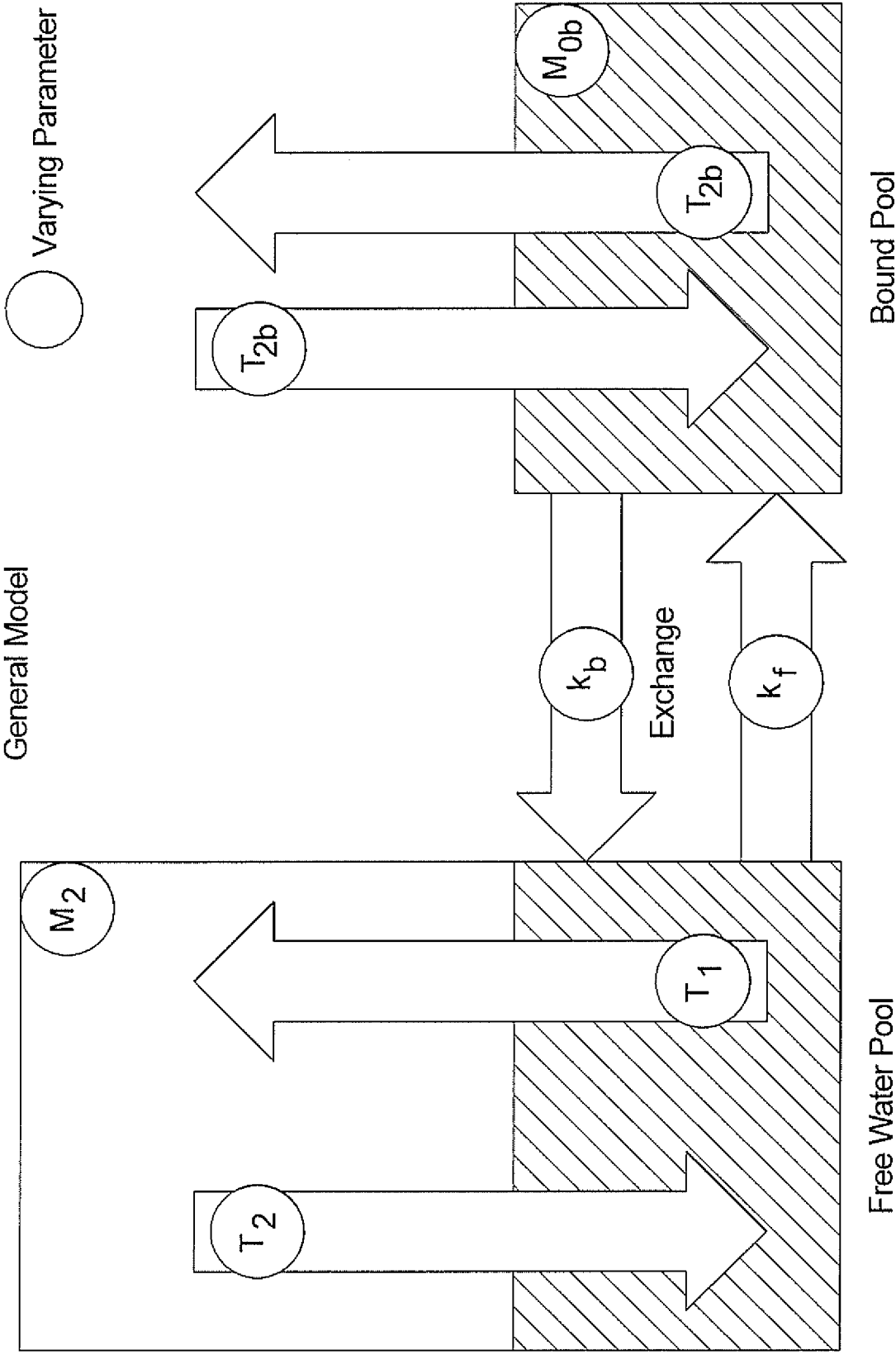
FIG. 2 flows the basic concept of the conventional general model for magnetization transfer.

The magnetization transfer effect is typically described with a two-pool model as illustrated in FIG. 2. The two pools represent the net magnetization produced by hydrogen atoms in free water and those bound to macromolecules. The equilibrium magnetization of these pools is denoted as $M_{of}$ and $M_{ob}$. The spectral distribution of the pools, a narrow Gaussian for free water and a wide super-Lorentzian for the bound pool, depend on the transverse relaxation times $T_{2f}$ and $T_{2b}$, respectively. A detailed description of the line shapes can be found in Morrison et al., "Modeling Magnetization Transfer for Biological-Like Systems Using a Semi-Solid Pool with a Super-Lorentzian Lineshape and Dipolar Reservoir," *J. Magn Reson, Series B*, 108(2) (1995). Due to the differences in line shape, a given RF-pulse affects each of these pools differently. In particular, the amount of saturation depends on the overlap between the bandwidth of the applied RF pulse and the spectral distribution of the spin pool, i.e. pulses with a larger bandwidth will saturate the solid pool more quickly. After (partial) saturation, their magnetization will return to equilibrium. In principle, each compartment can have a different characteristic longitudinal relaxation time ($T_{1f}$ and $T_{1b}$ in FIG. 1). In addition, the two pools exchange magnetization with each other at a fixed rate, described with one constant for each direction ($k_b$ and $k_f$). A more detailed description of common MT models can be found in the above-cited Henkelman et al. article.

Simplified MT Model

The original MR fingerprinting methods, which rely on the basic Bloch Equations or the Extended Phase Graph Formalism. Hennig et al., Calculation of Flip Angles for Echo Trains with Predefined Amplitudes with the Extended Phase Graph (EPG)-Algorithm Principles and Applications to Hyperecho and TRAPS Sequences," *Magnetic Resonance in Medicine*, 51(1) (2004), consider only the $T_{1f}$ and $T_{2f}$ constant in combination with the proton density PD and, in some cases, experimental conditions, such as inhomogeneities in the main magnetic field $B_0$ (see the cited article by Ma et al.) or variations in the radio-frequency field $B_1$ Cloos et al., "Multiparametric Imaging with Heterogeneous Radiofrequency Fields," *Nature Communication*, (2016). Considering that the proton density PD (denoted as $M_{of}$ in FIG. 2) scales the overall magnitude of the signal, these signal-models are generally limited to three or four degrees of freedom.

Figure 3:
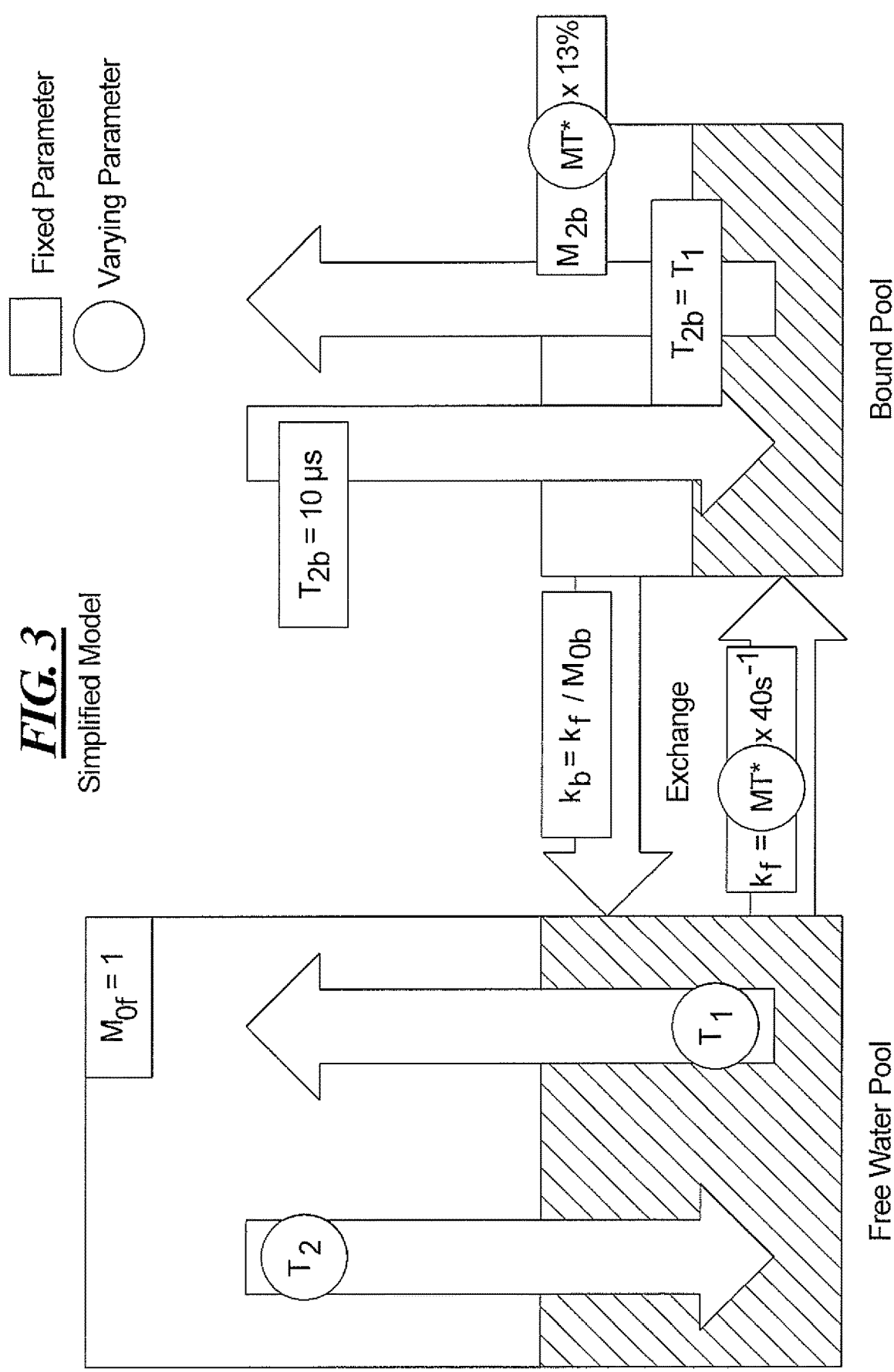
FIG. 3 schematically illustrates the simplified model for magnetization transfer in accordance with the present invention.

Each new model parameter adds an additional degree of freedom to the model—scaling up the computational efforts necessary to create and use it. Thus, including the additional five parameters required for the common MT model, introduced above, leads to unpractical, if not unfeasible, computational times. Furthermore, the typical MRF sequence design may not encode all these parameters strongly enough to perform reliable dictionary fitting. Therefore, a simplified MT model is derived in accordance with the invention, which condenses the additional degrees of freedom into a single parameter MT*, as shown in FIG. 3. Although this parameter no longer reflects a quantitative MT estimation, it is designed to estimate the MT bias and enables more accurate estimation of free water pool $T_{1f}$ and $T_{2f}$ relaxation times.

The simplified model is realized by discretizing the longitudinal magnetization of the bound pool into multiple $N_b$ frequency bands (1-100 Hz, 101-200 Hz, 9,901-10,000 Hz). At the beginning of the simulation, the magnitude of the longitudinal magnetization $M_{2b}$, in each band i, depends on $M_{0b}$ and the bound pool frequency line shape G. By multiplying each bin with G, the initial magnetization of the semisolid pool has the desired line shape at the beginning of the simulation:

$$M_{zb,i} = M_{0b} G_i \qquad (1)$$

Here, G is a super-Lorentzian line shape which is defined as follows:

$$G_i = \int_0^{\pi/2} d\theta \sin\theta \sqrt{\frac{2}{\pi}} \frac{T_{2b}}{|3\cos^2\theta - 1|} \exp\left(-2\left(\frac{2\pi f_i T_{2b}}{|3\cos^2\theta_1|}\right)^2\right) \qquad (2)$$

where $f_i$ is the center frequency of the i-th band. Since always the center frequency is used, the line shape is never calculated on-resonant, thus the singularity of the super-Lorentzian is avoided. Here we also introduce the assumption that $T_{2b}=10$ μs, based on the previously reported value range of 9-11 μs (Morrison et al. cited above, Stanisz et al. "Characterizing White Matter With Magnetization Transfer and $T_2$" *Magnetic Resonance in Medicine*, Vol. 42, pp. 1128-1136 (1999)).

When applying an RF pulse, only a fraction of the bound pool bands is saturated. The level of saturation depends on the shape, flip angle, and bandwidth of the pulse. In the numerical simulation, saturation is performed by multiplying the longitudinal magnetization $M_{zb}$ with a Gaussian saturation profile W for each band 1. Therefore, the longitudinal magnetization after saturation $M_{2b-i}$ is defined as $$M_{zb+1,i} = M_{zb,i} W_i \qquad (3)$$

Figure 4:
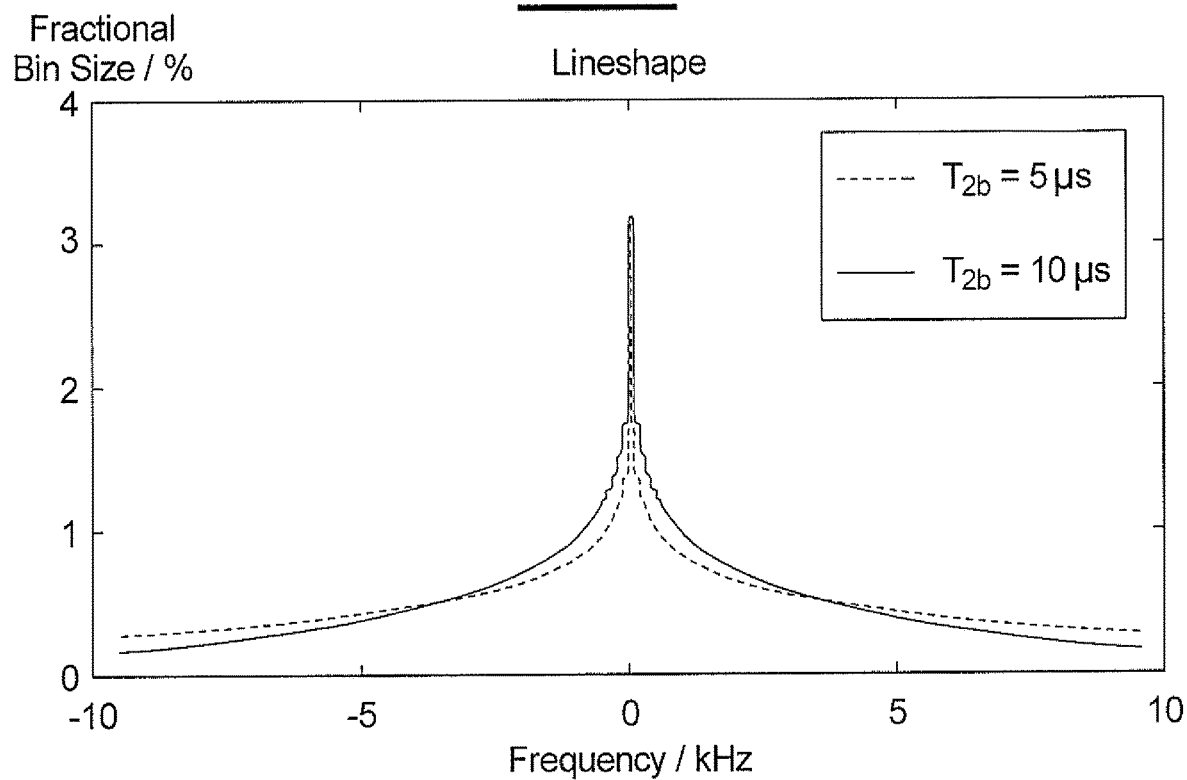
FIG. 4 shows super-Lorentzian line shapes for different values of $T_{2b}$ in the simplified model in accordance with the invention.
Figure 5:
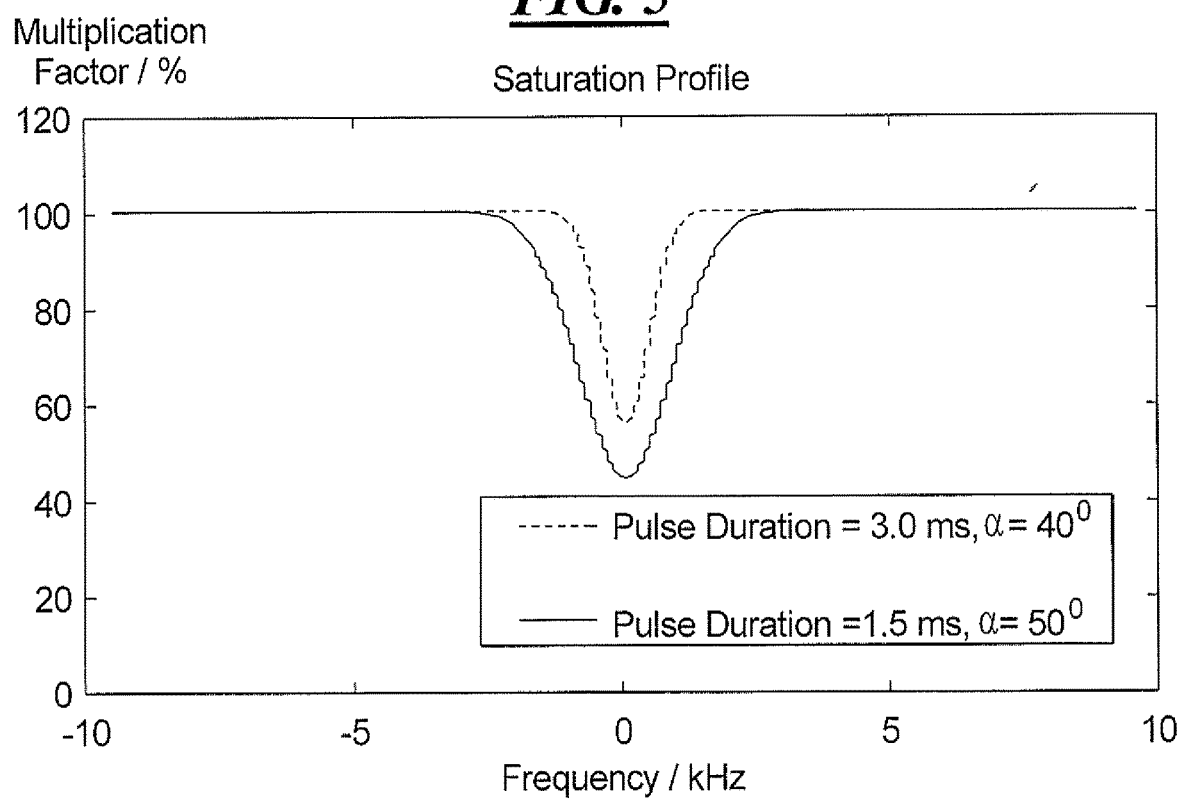
FIG. 5 shows exemplary saturation profiles for different RF pulse durations in the simplified model according to the present invention.

For illustration, two exemplary super-Lorentzian line shapes G and exemplary saturation profiles W are shown in FIGS. 4 and 5. Following each RF pulse, the longitudinal magnetization of the bound pool relaxes back towards the equilibrium state. Therefore, a relaxation operator is applied using the assumption from (Stanisz et al., cited above) that $T_{1b}=1$ s. To this end, the longitudinal magnetization of the bound pool $M_{2b}$ within each band i is changed during one TR (denoted as j) to $M_{2b-i}$, following $$M_{zb+1,i} = M_{zb,i} E_1 + M_{0b} G_i (1 - E_1) \qquad (4)$$

with $E_1 = \exp(-t/T_1) \qquad (5)$

Furthermore, the exchange of magnetization between the bound and free water pool is simulated by supplying an exchange operator, as previously suggested by Gloor et al, "Quantitative Magnetization Transfer Imaging Using Balanced SSFP," *Magnetic Resonance in Medicine*, 60(3), 691-700 (2008), which mainly depends on the exchange rate parameters $k_f$ and $k_b$ as well as the equilibrium magnetizations $M_{0f}$ and $M_{0b}$. One additional consideration that must be taken into account during application of the exchange operator is the discretization of the slice profile into $N_f$ different flip-angle bins (Cloos et al.; Ma et al., cited above) and the discretization of the bound pool into different frequency bands. Typically, the slice profile is binned to account for B1 variations across the slice profile. Therefore, the transfer of magnetization from the free pool to each band in the bound pool was calculated based on the sum over the slice profile. Conversely, the transfer of magnetization to each bin in the slice profile is calculated based on the sum over the line shape of the bound pool. Thus, the longitudinal magnetization of the bound pool $M_{2b}$ and the free water pool $M_{0f}$ change according to $$M_{zf+1,k} = S_k \left( \frac{\left(\sum_{i=0}^{N_b} M_{zb,i} + M_{zf,k} S_k^{-1}\right) - \left(\sum_{i=0}^{N_b} M_{zb,i} + F M_{zf,k} S_k^{-1}\right) \exp(-tk_f(F+1))}{F+1} \right), \qquad (6)$$

$$M_{zb+1,i} = G_i \left( \frac{F\left(M_{zb,i} G_i^{-1} + \sum_{k=0}^{N_f} M_{zf,k}\right) + \left(M_{zb,i} G_i^{-1} + F \sum_{k=0}^{N_f} M_{zf,k}\right) \exp(-tk_f(F+1))}{F+1} \right). \qquad (7)$$

The exchange rates are known to be linked through the fractional pool size at equilibrium ($k_b = k_f/M_{0b}$). In the simulation, the equilibrium magnetization of the free pool is fixed to 1 (note that the PD is ultimately determined by the ratio between the simulated and measured signal). In the simplified model shown n FIG. 3, the effect of MT can thus be narrowed down to two variables, the exchange rate kf and the fractional pool size $M_{0b}$, which can be condensed into a single scaling variable MT* when using literature values and the assumption of having the same ratio between $k_f$ and $M_{0b}$ $k_f$=MT*×23 s$^{-1}$ and $M_{0b}$=MT*×0 13. In the schematic drawing of the simplified model shown in FIG. 3, the above-introduced assumptions are shown in rectangular boxes and the free parameters that need to be estimated in circles.

Notably, besides fixing parameters to literature values and condensing two parameters into a single MT* parameter, multiple major assumptions were made to simplify the common MT model. First, the contribution of signal from the transverse magnetization of the bound pool is neglected during the simulation because the reported $T_{2b}$ values of the bound pool (~9-11 μs) are orders of magnitudes shorter than the TR in the sequence (typically 7-11 ms). Therefore, the transverse magnetization of the bound pool will dephase completely before the application of the next pulse, or even the readout. Second, following Gloor et al., cited above), the subsequent application of saturation, relaxation, and exchange operators assume that these effects can be decoupled and still yield a good approximation in comparison to solving the differential Bloch Equations Modified Sequence Design Following the above inventive strategy, ways to most efficiently mitigate the MT effect are not sought but, to the contrary, the MT effect is encoded in the acquired signal. To this end, any suitable technique to modulate the strength of the MT is encompassed by the present invention. As described above, the two molecules pools with their associated spins have different frequency bands, the bound water pool has a wide frequency range, whereas the frequency band of the free water pool is narrow. Consequently, one way to imprint different amounts of MT preparation in the signal is to change the bandwidth of the excitation pulse—a wider excitation pulse excites/saturates more spins in the bound water pool than a narrow pulse. In order to encode the MT effect in the signal, the acquisition has to be performed with RF pulses with at least two different bandwidths.

Figure 6:
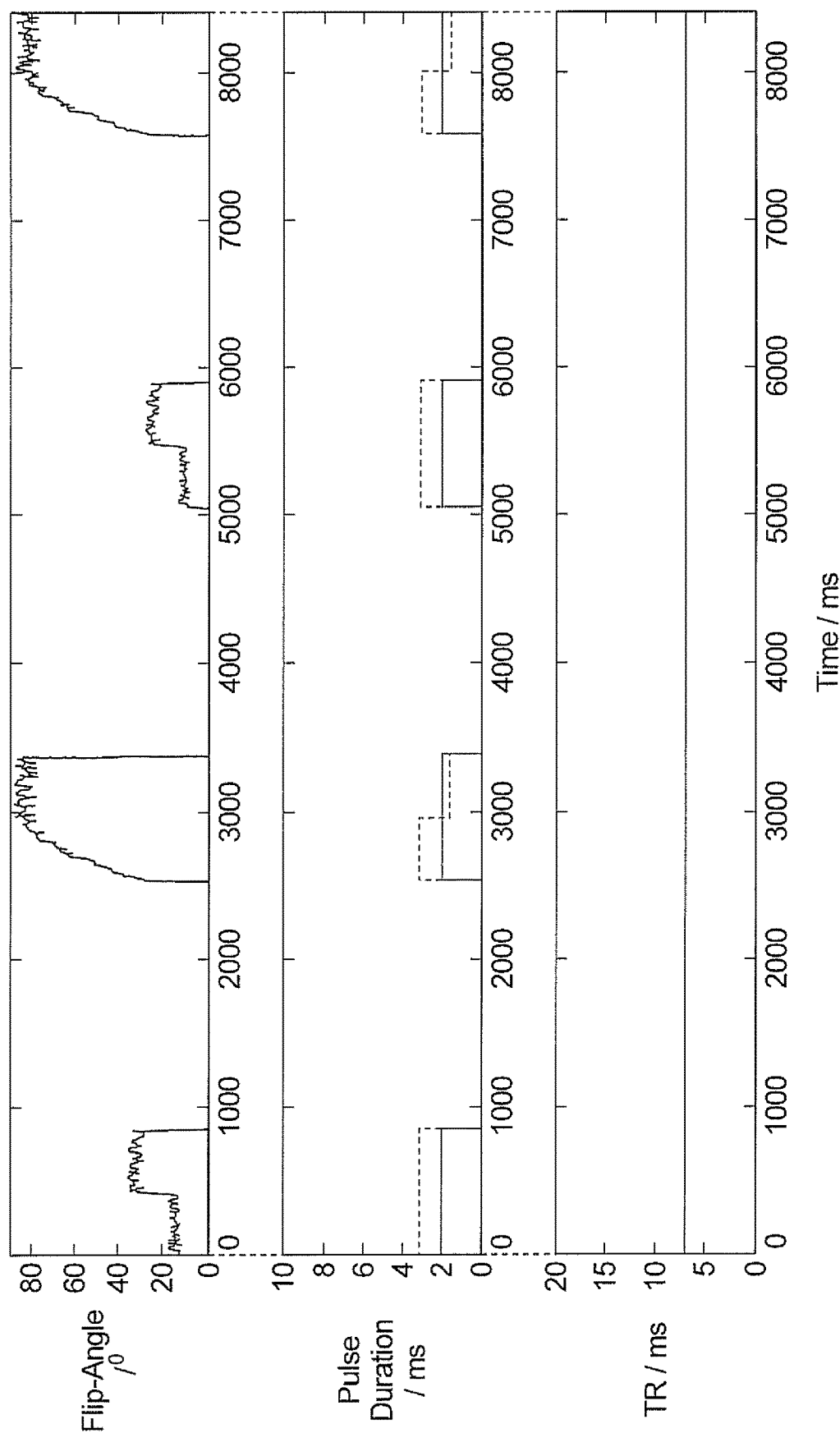
FIG. 6 shows an example of a pulse sequence for operating the MR apparatus of FIG. 1 in the context of the simplified model in accordance with the present invention.

This strategy can be implemented, for example, in the MRF-variant "PnP-MRF", originally proposed by Cloos et al., cited above. To change the pulse bandwidths, one simply has to change the pulse duration (→Fourier theory). The RF pulse duration is hence changed in the test sequence at set time intervals during the RF train, as shown in FIG. 6. The process of changing the RF duration is referred to herein as "MT encoding," since it introduces MT-dependent modulations of the signal, i.e. encodes MT in the fingerprints.

The basic inventive idea, however, is not limited to this kind of MT encoding. A separate, off-center MT saturation pulse, as it is used in traditional MT-contrast sequences, can be used to encode the MT effect in the signal. In addition to changing the pulse width, the pulse shape can be changed.

The invention thus is a paradigm change with respect to typically undesired MT effects. Instead of trying to mitigate their impact, the used quantitative method (exemplified with MRF here) is extended by two elements:

Encoding of MT into the measured MR signal by modulating the RF pulse bandwidth over the course of the acquisition; and Incorporating a simplified MT signal model into the used modelling technique.

By taking MT while acquiring the measured MR signal, the resulting model of the tissue microstructure is rendered more accurate and hence the derived tissue properties (e.g. T1 and T2) are more accurate as well, by removing additional influences from the experimental setup (sequence parameters).

In the above discussion, MT is modelled in order to remove the corresponding bias from the tissue parameters, but it is also possible to actually quantify MT using this concept. This is of interest because MT is related to myelin content in the brain, accurate quantification of myelin would establish a biomarker with high clinical significance.

The application of the invention to MRF is exemplified above. Other examples could use different or less or more simplifications as demonstrated. For example:

avoiding the combination of multiple variables into one, consequently having more dimensions in the dictionary;

combining different variables into one (e.g. instead of combining kf and MOb);

using different fixed values as suggested in the text above (e.g. fixing Tlb=1 s instead of Tlb=Tlf);

using different line shape in the frequency domain (e.g. Gaussian instead of super-Lorentzian);

using a different simulation (e.g. Bloch Equations instead of Extended Phase Graph Formalism);

adding additional parameter in the model (e.g. diffusion properties);

adding more pools to the model (e.g. three pools instead of two);

In the sequence design in accordance with the invention shown in FIG. 6, a switch is made between different pulse durations (i.e. bandwidth) within a radio-frequency train. Optionally, more than just two pulse durations could be used (e.g. many randomly chosen pulse durations). Also, the location or order in which the pulse duration is changed could vary but achieve similar results. Instead of changing the RF pulse duration, the shape of the RF pulse may be altered to change the RF bandwidth. These variations can be achieved by modulating the amplitude, phase, or both. Changes in RF pulse shape and duration can also be used in the signal model.

Although the presented example uses a 2D sequence, the same processes can also be applied to a 3D sequence.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A model-based method for identifying a nuclear spin-dependent attribute of a subject, comprising:

operating a magnetic resonance (MR) data acquisition scanner, while a subject is situated therein, in order to execute multiple repetitions of an MR data acquisition sequence that includes radiating a radio-frequency (RF) pulse that excites certain nuclear spins in the subject, so as to produce and then acquire an MR signal from the subject, said RF pulses producing magnetization transfer (MT) between the excited nuclear spins in the subject;

while operating said MR data acquisition scanner, changing said MR data acquisition sequence from repetition-to-repetition in order to encode effects of said MT in the MR signals respectively acquired in each repetition;

in a computer, generating a model composed of at least two molecule pools, in which a single MT parameter is used, which is derived from said MR signals in which said MT is encoded;

in said computer, comparing at least one MR signal evolution from said subject to at least one signal evolution produced by said model, in order to identify a nuclear spin-dependent attribute of the subject from a result of the comparison; and in said computer, generating an electrical output signal representing said attribute, and presenting a visual depiction of said attribute at an output interface of said computer.

2. A method as claimed in claim 1 comprising operating said MR data acquisition scanner, and making said comparison, in a magnetic resonance fingerprinting procedure.

3. A method as claimed in claim 1 comprising changing a bandwidth of said RF pulse from repetition-to-repetition of said MR data acquisition sequence in order to encode said MT in said MR signals respectively acquired in each repetition.

4. A method as claimed in claim 3 wherein said at least two molecule pools comprise a free water pool and water bound pool, and comprising generating said model by discretizing a longitudinal magnetization of said water bound pool into multiple frequency bands, corresponding to said different bandwidths of said RF pulses, and identifying a magnitude of the longitudinal magnetization in each band.

5. A method as claimed in claim 1 comprising identifying, as said attribute, at least one of $T_1$ relaxation and $T_2$ relaxation of the excited nuclear spins.

6. A method as claimed in claim 1 wherein said attribute is a biomarker for neurological disease.

7. A method as claimed in claim 6 wherein said biomarker is a myelin content of the brain of the subject.

8. A magnetic resonance (MR) apparatus comprising:
an MR data acquisition scanner; and
a computer configured to:
operate said MR data acquisition scanner, while a subject is situated therein, in order to execute multiple repetitions of an MR data acquisition sequence that includes radiating a radio-frequency (RF) pulse that excites certain nuclear spins in the subject, so as to produce and then acquire an MR signal from the subject, said RF pulses producing magnetization transfer (MT) between the excited nuclear spins in the subject;

change said MR data acquisition sequence while operating said MR data acquisition scanner, from repetition-to-repetition in order to encode effects of said MT in the MR signals respectively acquired in each repetition;

generate a model composed of at least two molecule pools, in which a single MT parameter is used, which is derived from said MR signals in which said MT is encoded;

compare at least one MR signal evolution from said subject to at least one signal evolution produced by said model, in order to identify a nuclear spin-dependent attribute of the subject from a result of the comparison; and generate an electrical output signal representing said attribute, and presenting a visual depiction of said attribute at an output interface of said computer.

9. An MR apparatus as claimed in claim 8 wherein said computer is configured to operate said MR data acquisition scanner, and to make said comparison, in a magnetic resonance fingerprinting procedure.

10. An MR apparatus as claimed in claim 8 wherein said computer is configured to change a bandwidth of said RF pulse from repetition-to-repetition of said MR data acquisition sequence in order to encode said MT in said MR signals respectively acquired in each repetition.

11. An MR apparatus as claimed in claim 10 wherein said at least two molecule pools comprise a free water pool and water bound pool, and wherein said computer is configured to generate said model by discretizing a longitudinal magnetization of said water bound pool into multiple frequency bands, corresponding to said different bandwidths of said RF pulses, and identifying a magnitude of the longitudinal magnetization in each band.

12. An MR apparatus as claimed in claim 8 wherein said computer is configured to identify, as said attribute, at least one of $T_1$ relaxation and $T_2$ relaxation of the excited nuclear spins.

13. An MR apparatus as claimed in claim 8 wherein said attribute is a biomarker for neurological disease.

14. An MR apparatus as claimed in claim 13 wherein said biomarker is a myelin content of the brain of the subject.

* * * * *